(12) United States Patent
Jeong

(10) Patent No.: US 11,264,097 B2
(45) Date of Patent: Mar. 1, 2022

(54) VOLTAGE GENERATION CIRCUIT AND SEMICONDUCTOR CIRCUIT INCLUDING THE VOLTAGE GENERATION CIRCUIT

(71) Applicant: SK hynix Inc., Icheon-si Gyeonggi-do (KR)

(72) Inventor: Chan Hui Jeong, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/906,784

(22) Filed: Jun. 19, 2020

(65) Prior Publication Data

US 2021/0202001 A1 Jul. 1, 2021

(30) Foreign Application Priority Data

Dec. 27, 2019 (KR) .......................... 10-2019-0176065

(51) Int. Cl.
*G11C 5/14* (2006.01)
*G11C 15/04* (2006.01)
*G05F 3/26* (2006.01)

(52) U.S. Cl.
CPC ............ *G11C 15/046* (2013.01); *G05F 3/262* (2013.01)

(58) Field of Classification Search
CPC ........... G11C 5/14; G11C 5/144; G11C 5/145; G11C 5/147; G11C 5/148; G05F 3/00; G05F 3/26; G05F 3/262; G05F 3/02; G05F 1/10; G05F 1/461; H01L 2924/1427

See application file for complete search history.

(56) References Cited

U.S. PATENT DOCUMENTS

| | | | |
|---|---|---|---|
| 8,344,754 B2 | 1/2013 | Kim et al. | |
| 9,484,071 B2 | 11/2016 | Jin | |
| 2011/0087811 A1 | 4/2011 | Kondo et al. | |
| 2015/0054480 A1* | 2/2015 | Meher | H02M 3/156 323/282 |

FOREIGN PATENT DOCUMENTS

| | | |
|---|---|---|
| KR | 1020140013893 A | 2/2014 |
| KR | 1020210023025 A | 3/2021 |
| KR | 1020210033719 A | 3/2021 |

* cited by examiner

*Primary Examiner* — Alfredo Bermudez Lozada
(74) *Attorney, Agent, or Firm* — William Park & Associates Ltd.

(57) ABSTRACT

A voltage generation circuit includes a driver configured to generate an internal voltage by driving an external voltage depending on a driving signal; an amplifier configured to generate the driving signal depending on a result of comparing a reference voltage and a feedback voltage; and a switch configured to delay a decrease of the internal voltage by precharging a node of the amplifier with a predetermined voltage depending on a control signal.

17 Claims, 3 Drawing Sheets

VOLTAGE GENERATION CIRCUIT AND SEMICONDUCTOR CIRCUIT INCLUDING THE VOLTAGE GENERATION CIRCUIT

CROSS-REFERENCES TO RELATED APPLICATION

The present application claims priority under 35 U.S.C. § 119(a) to Korean application number 10-2019-0176065, filed on Dec. 27, 2019, in the Korean Intellectual Property Office, which is incorporated herein by reference in its entirety.

BACKGROUND

1. Technical Field

Various embodiments generally relate to a semiconductor circuit, and particularly, to a voltage generation circuit.

2. Related Art

A semiconductor circuit employs voltage generation circuits to generate various levels of internal power essential for the operations of internal circuits by using external power.

In order for a semiconductor circuit, for example, a semiconductor memory circuit, to be switched to an active mode and perform a data input/output operation, a voltage generation circuit is designed to have a fast reaction speed by increasing its driving capability. In the case where a reaction speed is fast, a problem such as peak current and overshoot may be caused at an initial operation stage such as a power-up state.

SUMMARY

In an embodiment, a voltage generation circuit may include: a driver configured to generate an internal voltage by driving an external voltage depending on a driving signal; an amplifier configured to generate the driving signal depending on a result of comparing a reference voltage and a feedback voltage; and a switch configured to delay a decrease of the internal voltage by precharging a node of the amplifier with a predetermined voltage depending on a control signal.

In an embodiment, a voltage generation circuit may include: a driver configured to generate an internal voltage by driving an external voltage depending on a driving signal; a comparator configured to generate a comparison signal by comparing a reference voltage and a feedback voltage; a current mirror configured to generate the driving signal depending on the comparison signal; and a switch configured to delay a decrease of the internal voltage by precharging a node, coupled with a transistor for pulling down the driving signal in the current mirror, to a predetermined voltage, depending on a control signal.

In an embodiment, a semiconductor circuit may include a voltage generation circuit. The voltage generation circuit may include: a driver configured to generate an internal voltage by driving an external voltage depending on a driving signal; an amplifier configured to generate the driving signal depending on a result of comparing a reference voltage and a feedback voltage; a switch configured to delay a decrease of the internal voltage by precharging a node of the amplifier with a predetermined voltage depending on a control signal; and a control signal generation circuit configured to generate one of a ground voltage and the external voltage, as the control signal, depending on setting information. The setting information may be changed in the content-addressable memory (CAM) read period of the semiconductor circuit.

DETAILED DESCRIPTION

It will be understood that although the terms "first," "second," "third" etc. may be used herein to describe various elements, these elements should not be limited by these terms. These terms are only used to distinguish one element from another element, but not used to define only the element itself or to mean a particular sequence. The word "predetermined" as used herein with respect to a parameter, such as a predetermined voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Hereinafter, a voltage generation circuit will be described below with reference to the accompanying drawings through various examples of embodiments.

Various embodiments are directed to a voltage generation circuit capable of reducing peak current and performing a stable operation.

Figure 1:
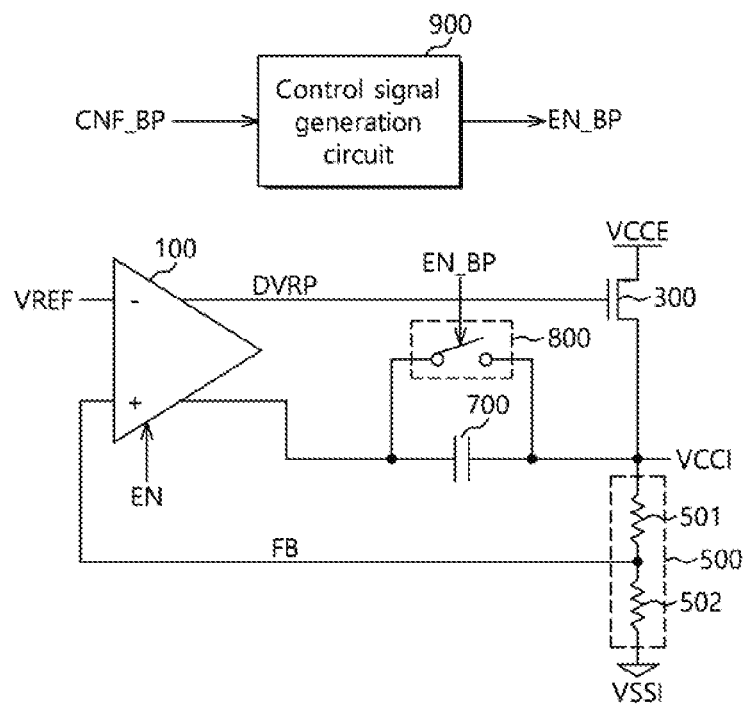
FIG. 1 is a diagram illustrating a representation of an example of the configuration of a voltage generation circuit in accordance with an embodiment of the disclosure.

FIG. 1 is a diagram illustrating a representation of an example of the configuration of a voltage generation circuit 10 in accordance with an embodiment of the disclosure.

Referring to FIG. 1, the voltage generation circuit 10 may include an amplifier 100, a driver 300, a dividing resistor 500, a capacitor 700, a switch 800, and a control signal generation circuit 900.

The amplifier 100 may generate a driving signal DRVP according to a result of comparing a reference voltage VREF and a feedback voltage FB. The amplifier 100 may be activated according to an enable signal EN.

The driver 300 may generate an internal voltage VCCI by driving an external voltage VCCE depending on the driving signal DRVP.

In an embodiment, the driver 300 may include an PMOS transistor. The PMOS transistor may have a source terminal to which the external voltage VCCE is applied, a gate terminal which receives the driving signal DRVP, and a drain terminal to which the terminal of the internal voltage VCCI is coupled.

The dividing resistor 500 may generate the feedback voltage FB by dividing the internal voltage VCCI.

The dividing resistor 500 may include resistors 501 and 502 which are coupled between the terminal of the internal voltage VCCI and a terminal of a ground voltage VSSI.

The capacitor 700 may be coupled between the terminal of the internal voltage VCCI and the amplifier 100.

The capacitor 700 may remove the noise of the internal voltage VCCI. In an embodiment, the capacitor 700 may mitigate the noise of the internal voltage VCCI.

Because the capacitor 700 is configured for noise prevention purposes, it may be designed to have a substantially large capacitance value. That is to say, the capacitor 700 may be designed to have capacitance having a relatively large value compared to the capacitance of the transistors of the voltage generation circuit 10.

The switch 800 may delay the decrease of the internal voltage VCCI by precharging a node of the amplifier 100 with the internal voltage VCCI depending on a control signal EN_BP.

The switch 800 may delay the decrease of the internal voltage VCCI by providing the internal voltage VCCI to the amplifier 100, as a precharge voltage, depending on the control signal EN_BP.

The switch 800 may be coupled to nodes of both ends of the capacitor 700.

The switch 800 may short the nodes of both the ends of the capacitor 700 depending on the control signal EN_BP, thereby allowing the internal voltage VCCI to be provided to the amplifier 100 as the precharge voltage.

The switch 800 may short the nodes of both the ends of the capacitor 700, by being turned on in the case where the control signal EN_BP is at a low level.

The switch 800 may prevent the nodes of both the ends of the capacitor 700 from being shorted, by being turned off in the case where the control signal EN_BP is at a high level.

The control signal generation circuit 900 may generate the control signal EN_BP depending on setting information CNF_BP.

The value of the setting information CNF_BP may be changed in a content-addressable memory (CAM) read period to be described later, that is, a period for a setting information read operation as one of active operations.

Figure 2:
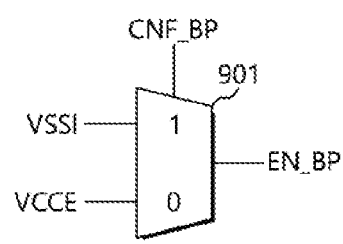
FIG. 2 is a diagram illustrating a representation of an example of the configuration of a control signal generation circuit is illustrated in FIG. 1.

FIG. 2 is a diagram illustrating a representation of an example of the configuration of the control signal generation circuit 900 illustrated in FIG. 1.

Referring to FIG. 2, the control signal generation circuit 900 may generate one of the level of the ground voltage VSSI and the level of the external voltage VCCE as the control signal EN_BP depending on the setting information CNF_BP.

The control signal generation circuit 900 may generate the level of the ground voltage VSSI as the control signal EN_BP in the case where the setting information CNF_BP is at a low level.

The control signal generation circuit 900 may generate the level of the external voltage VCCE as the control signal EN_BP in the case where the setting information CNF_BP is at a high level.

The control signal generation circuit 900 may include a multiplexer 901.

The multiplexer 901 may receive the ground voltage VSSI through a first input terminal thereof, may receive the external voltage VCCE through a second input terminal thereof, may receive the setting information CNF_BP through a control terminal thereof, and may generate the control signal EN_BP through an output terminal thereof.

Figure 3:
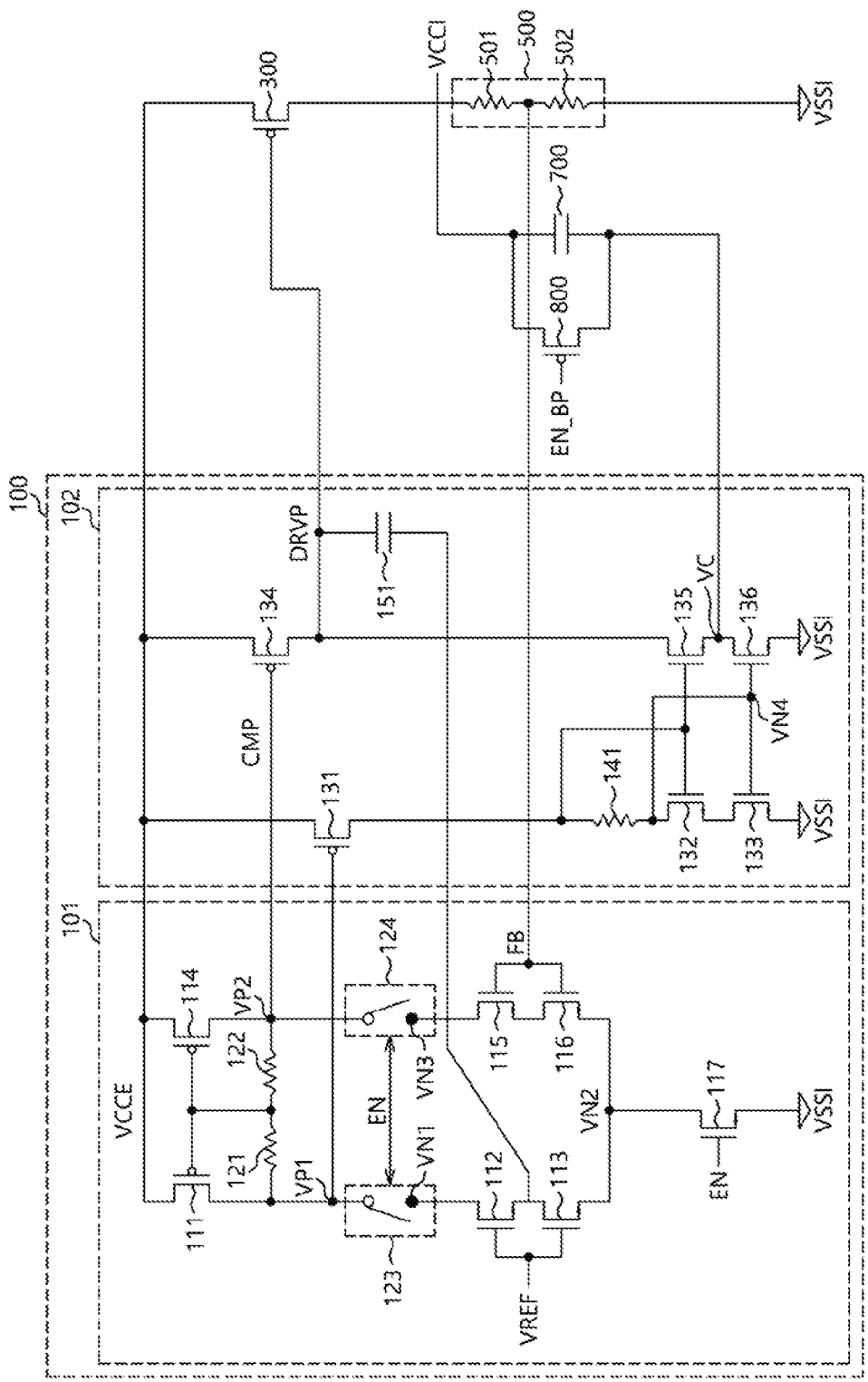
FIG. 3 is a diagram illustrating a representation of an example of the detailed circuit configuration of the voltage generation circuit in accordance with the embodiments of the disclosure.

FIG. 3 is a diagram illustrating a representation of an example of the detailed circuit configuration of the voltage generation circuit 10 in accordance with the embodiment of the disclosure.

Referring to FIG. 3, the amplifier 100 of the voltage generation circuit 10 may include a comparator 101 and a current mirror 102.

The comparator 101 may generate a comparison signal CMP by comparing the reference voltage VREF and the feedback voltage FB.

The current mirror 102 may generate the driving signal DRVP depending on the comparison signal CMP.

The comparator 101 may include first to seventh transistors 111 to 117, first and second resistors 121 and 122, and first and second switches 123 and 124.

The first transistor 111 may have a source terminal to which the external voltage VCCE is applied, and a drain terminal which is coupled with a first node VP1.

The first switch 123 may have one end which is coupled with the first node VP1, and the other end which is coupled with a second node VN1.

The second transistor 112 may have a source terminal which is coupled with the second node VN1, and a gate terminal which receives the reference voltage VREF.

The third transistor 113 may have a source terminal which is coupled with a drain terminal of the second transistor 112, a drain terminal which is coupled with a third node VN2, and a gate terminal which receives the reference voltage VREF.

The fourth transistor 114 may have a source terminal to which the external voltage VCCE is applied, and a drain terminal which is coupled with a fourth node VP2.

The comparison signal CMP may be outputted through the fourth node VP2.

The first resistor 121 may have one end which is coupled with the drain terminal of the first transistor 111, and the other end which is coupled in common to a gate terminal of the first transistor 111 and a gate terminal of the fourth transistor 114.

The second resistor 122 may have one end which is coupled with the drain terminal of the fourth transistor 114, and the other end which is coupled with the other end of the first resistor 121.

The second switch 124 may have one end which is coupled with the fourth node VP2, and the other end which is coupled with a fifth node VN3.

The fifth transistor 115 may have a source terminal which is coupled with the fifth node VN3, and a gate terminal which receives the feedback voltage FB.

The sixth transistor 116 may have a source terminal which is coupled with a drain terminal of the fifth transistor 115, a drain terminal which is coupled with the third node VN2, and a gate terminal which receives the feedback voltage FB.

The seventh transistor 117 may have a source terminal which is coupled with the third node VN2, a drain terminal which is coupled with a terminal of the ground voltage VSSI, and a gate terminal which receives an enable signal EN.

The current mirror 102 may include first to sixth transistors 131 to 136, a resistor 141, and a capacitor 151.

The first transistor 131 may have a source terminal to which the external voltage VCCE is applied, and a gate terminal which is coupled with the first node VP1.

The resistor 141 may have one end which is coupled with a drain terminal of the first transistor 131.

The second transistor 132 may have a source terminal which is coupled with the other end of the resistor 141, and a gate terminal which is coupled with the one end of the resistor 141.

The third transistor 133 may have a source terminal which is coupled with a drain terminal of the second transistor 132, a gate terminal which is coupled with a sixth node VN4, and a drain terminal which is coupled with a terminal of the ground voltage VSSI.

The fourth transistor 134, that is, a driving signal pull-up transistor, may pull up the driving signal DRVP depending on the comparison signal CMP outputted through the fourth node VP2.

The fourth transistor 134 may have a source terminal to which the external voltage VCCE is applied, a gate terminal which is coupled with the fourth node VP2, and a drain terminal through which the driving signal DRVP is generated.

The fifth transistor 135 and the sixth transistor 136, that is, driving signal pull-down transistors, may pull down the driving signal DRVP depending on a level of the first node VP1.

The fifth transistor 135 may have a source terminal which is coupled with the drain terminal of the fourth transistor 134, a gate terminal which is coupled with the one end of the resistor 141, and a drain terminal which is coupled with a seventh node VC.

The sixth transistor 136 may have a source terminal which is coupled with the seventh node VC, a gate terminal which is coupled with the sixth node VN4, and a drain terminal which is coupled with a terminal of the ground voltage VSSI.

The capacitor 151 may have one end which is coupled with the drain terminal of the fourth transistor 134, and the other end which is coupled with the drain terminal of the second transistor 112 of the comparator 101.

Figure 4:
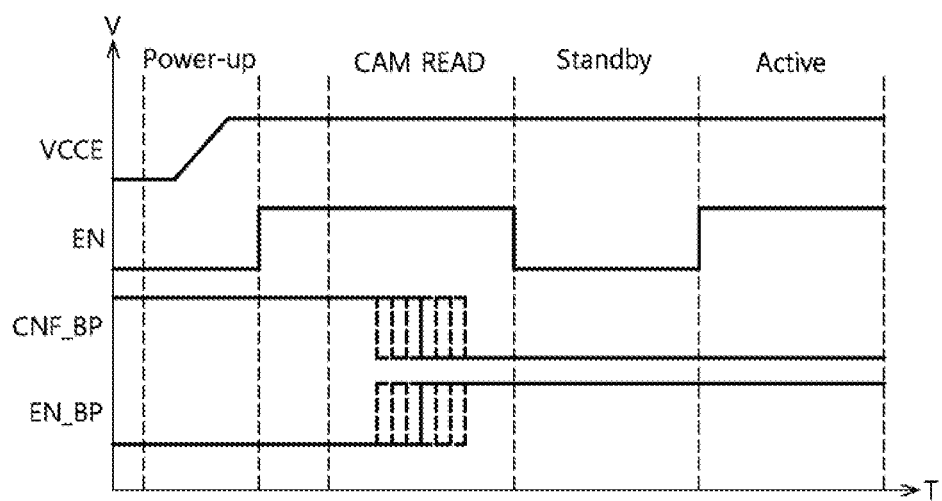
FIG. 4 is a representation of an example of a timing diagram to assist in the explanation of the operation of the voltage generation circuit in accordance with the embodiments of the disclosure.

FIG. 4 is a representation of an example of a timing diagram to assist in the explanation of the operation of the voltage generation circuit 10 in accordance with the embodiments of the disclosure.

In a power-up period, the level of the external voltage VCCE may rise and be maintained at a target level.

The enable signal EN may be maintained at a low level during the power-up period and a standby period, and may be maintained at a high level during a CAM read period and an active period.

The CAM read period, that is, a setting information read period, as a period essentially included before a normal operation period in a semiconductor circuit, for example, a NAND flash memory, may be included, for example, after the power-up period.

The setting information CNF_BP may be maintained at a high level and be then changed to a low level in the CAM read period.

Timing for the change in the setting information CNF_BP is not fixed, and the change may be implemented with an appropriate margin in the CAM read period.

As described above with reference to FIG. 2, the control signal EN_BP may have a value opposite to the setting information CNF_BP, but its transition timing may be the same as the setting information CNF_BP.

Since the control signal EN_BP is at a low level during the power-up period, the switch 800 of FIG. 3 may be turned on, and accordingly, may precharge the seventh node VC to the level of the internal voltage VCCI.

The fifth transistor 135 and the sixth transistor 136 of the current mirror 102 may decrease the level of the driving signal DRVP depending on the level of the first node VP1.

However, since the seventh node VC is at the level of the internal voltage VCCI, the fifth transistor 135 and the sixth transistor 136 of the current mirror 102 may be turned off, thereby preventing the level of the driving signal DRVP from being decreased.

The capacitor 700 is designed to have capacitance having a relatively large value compared to the capacitance of the transistors of the voltage generation circuit 10. Thus, the voltage level of the seventh node VC may be slowly decreased until the levels of the first to sixth nodes VP1, VN1, VN2, VP2, VN3 and VN4 are stabilized.

As described above, by decreasing the driving capability of the voltage generation circuit 10 during a first period including an initial operation stage, that is, the power-up period, of the voltage generation circuit 10 and thereby decreasing a reaction speed, it is possible to prevent problems, such as peak current and overshoot, caused in the case where the reaction speed of the voltage generation circuit 10 at the initial operation stage is high.

As the setting information CNF_BP is changed to a low level in the CAM read period, the control signal EN_BP may be changed to a high level.

Because the control signal EN_BP is at a high level, the switch 800 of FIG. 3 may be turned off, and accordingly, the voltage level of the seventh node VC may be decreased at a relatively high speed compared to the case where it is precharged to the level of the internal voltage VCCI.

In a second period after the control signal EN_BP is changed to a high level, a reaction speed may be increased by increasing the driving capability of the voltage generation circuit 10.

Therefore, in the subsequent active period, the driving capability of the voltage generating circuit 10 may be increased to increase the reaction speed. Accordingly, an active operation, for example, a data input/output operation, of the semiconductor circuit using the internal voltage VCCI may be quickly performed.

As a result, according to the embodiments of the disclosure, driving capability is decreased in a first period including a power-up period at an initial operation stage, thereby decreasing a reaction speed and preventing peak current and overshoot, and is increased in advance in a marginal period, that is, a CAM read period, after the power-up period, thereby allowing an active operation, for example, a data input/output operation of a semiconductor circuit, to be quickly performed in a subsequent second period.

While various embodiments have been described above, it will be understood to those skilled in the art that the embodiments described are examples only. Accordingly, the voltage generation circuit described herein should not be limited based on the described embodiments.

What is claimed is:

1. A voltage generation circuit comprising:
   a driver configured to generate an internal voltage by driving an external voltage in response to a level variation of a driving signal;
   an amplifier configured to be input an enable signal and configured to generate the driving signal depending on a result of comparing a reference voltage and a feedback voltage in response to the enable signal; and
   a switch configured to be input a control signal and configured to prevent the level variation of the driving signal by precharging a node of the amplifier with a predetermined voltage in response to the control signal.

2. The voltage generation circuit of claim 1, wherein a driving capability of the driver is decreased in response to an activation of the control signal during a first period including a power-up period, and is increased in response to a deactivation of the control signal during a second period including a standby period and an active period after the first period.

3. The voltage generation circuit of claim 1, further comprising:
a capacitor coupled between a node where the internal voltage is generated and the amplifier,
wherein the switch is directly coupled between both ends of the capacitor in parallel.

4. The voltage generation circuit of claim 3, wherein the switch is turned-on and apply the internal voltage to the amplifier directly in response to the control signal during the power-up period, and the switch is turned-off in response to the control signal changed in a content-addressable memory (CAM) read period after the power-up period.

5. The voltage generation circuit of claim 1, wherein the internal voltage is used as the predetermined voltage.

6. The voltage generation circuit of claim 1, further comprising:
a control signal generation circuit configured to generate one of a ground voltage and the external voltage, as the control signal, depending on setting information.

7. The voltage generation circuit of claim 6, wherein the setting information is changed in the CAM read period of a semiconductor circuit which includes the voltage generation circuit.

8. The voltage generation circuit of claim 1, further comprising:
a dividing resistor configured to generate the feedback voltage by dividing the internal voltage.

9. A voltage generation circuit comprising:
a driver configured to generate an internal voltage by driving an external voltage in response to a level variation of a driving signal;
a comparator configured to be input an enable signal and configured to generate a comparison signal by comparing a reference voltage and a feedback voltage in response to the enable signal;
a current mirror configured to generate the driving signal depending on the comparison signal; and
a switch configured to be input a control signal and configured to prevent the level variation of the driving signal by precharging a node, coupled with a transistor for pulling down the driving signal in the current mirror, to a predetermined voltage, in response to the control signal.

10. The voltage generation circuit of claim 9, wherein a driving capability of the driver is decreased in response to an activation of the control signal during a first period including a power-up period, and is increased in response to a deactivation of the control signal during a second period including a standby period and an active period after the first period.

11. The voltage generation circuit of claim 9, further comprising:
a capacitor coupled between a node where the internal voltage is generated and a node which is coupled with a transistor for pulling down the driving signal,
wherein the switch is directly coupled between both ends of the capacitor in parallel.

12. The voltage generation circuit of claim 11, wherein the switch is turned-on and apply the internal voltage to the amplifier directly in response to the control signal during the power-up period, and the switch is turned-off in response to the control signal changed in a content-addressable memory (CAM) read period after the power-up period.

13. The voltage generation circuit of claim 9, wherein the internal voltage is used as the predetermined voltage.

14. The voltage generation circuit of claim 9, further comprising:
a control signal generation circuit configured to generate one of a ground voltage and the external voltage, as the control signal, depending on setting information.

15. The voltage generation circuit of claim 14, wherein the setting information is changed in the CAM read period of a semiconductor circuit which includes the voltage generation circuit.

16. The voltage generation circuit of claim 9, further comprising:
a dividing resistor configured to generate the feedback voltage by dividing the internal voltage.

17. A semiconductor circuit comprising:
a voltage generation circuit comprising:
a driver configured to generate an internal voltage by driving an external voltage in response to a level variation of a driving signal;
an amplifier configured to be input an enable signal and configured to generate the driving signal depending on a result of comparing a reference voltage and a feedback voltage in response to the enable signal;
a switch configured to be input a control signal and configured to prevent the level variation of the driving signal by precharging a node of the amplifier with a predetermined voltage in response to the control signal;
a control signal generation circuit configured to generate one of a ground voltage and the external voltage, as the control signal, depending on setting information,
wherein the setting information is changed in the content-addressable memory (CAM) read period of the semiconductor circuit.

* * * * *